(12) United States Patent
Choi et al.

(10) Patent No.: US 8,686,768 B2
(45) Date of Patent: Apr. 1, 2014

(54) PHASE LOCKED LOOP

(71) Applicant: SK hynix Inc., Gyeonggi-do (KR)

(72) Inventors: Hae-Rang Choi, Gyeonggi-do (KR); Yong-Ju Kim, Gyeonggi-do (KR); Jae-Min Jang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/844,865

(22) Filed: Mar. 16, 2013

(65) Prior Publication Data

US 2013/0222025 A1     Aug. 29, 2013

Related U.S. Application Data

(62) Division of application No. 12/916,901, filed on Nov. 1, 2010, now Pat. No. 8,410,836.

(30) Foreign Application Priority Data

Jun. 21, 2010 (KR) .................. 10-2010-0058432

(51) Int. Cl.
*H03L 7/06* (2006.01)

(52) U.S. Cl.
USPC ............ 327/157; 375/376; 375/373; 327/156

(58) Field of Classification Search
USPC .......................... 327/157, 156; 375/376, 373
See application file for complete search history.

(56) References Cited

U.S. PATENT DOCUMENTS

| | | | |
|---|---|---|---|
| 2008/0007311 A1* | 1/2008 | Choi | 327/156 |
| 2008/0129353 A1* | 6/2008 | Lin | 327/157 |
| 2011/0221494 A1* | 9/2011 | Chen et al. | 327/157 |

* cited by examiner

*Primary Examiner* — Ryan Jager
(74) *Attorney, Agent, or Firm* — IP & T Group LLP (57) ABSTRACT

A phase locked loop includes a phase detector configured to compare a phase of an input clock with a phase of a feedback clock to produce a phase comparison result, an initial frequency value provider configured to detect a frequency of the input clock and provide a frequency detection result, a controller configured to generate a frequency control signal based on the phase comparison result and the frequency detection result, and an oscillator configured to generate an output clock in response to the frequency control signal.

5 Claims, 7 Drawing Sheets

PHASE LOCKED LOOP

CROSS-REFERENCE TO RELATED APPLICATIONS

This application is a division of U.S. patent application Ser. No. 12/916,901 filed on Nov. 1, 2010, which claims priority of Korean Patent Application No. 10-2010-0058432 filed on Jun. 21, 2010. The disclosure of the foregoing application is which is incorporated herein by reference in its entirety.

BACKGROUND OF THE INVENTION

Exemplary embodiments of the present invention relate to a technology for reducing locking time of a Phase Locked Loop (PLL).

Technology of generating and using an internal clock is essential to a high-speed synchronous system. Mobile devices have been adopting the high-speed synchronous system as well. As a frequency of a system becomes higher, more power may be consumed in the system. Therefore, technology for reducing power consumption is needed in the system, especially in such mobile devices.

To reduce the amount of power consumption, physical methods such as decreasing parasitic components and lowering the level of power source voltage through micro-processing are used. Such physical methods, however, may require additional expenses. For this reason, a method of reducing power consumption within a system may be desirable. To reduce the power consumption within a system, a method of turning off a circuit which is not currently used inside the system or decreasing the operation frequency of the circuit is usually used. If it is possible to turn off a circuit or quickly change its frequency, power consumption can be reduced.

In particular, it may be desirable to reduce a locking time in a circuit like a phase locked loop, which generates an internal clock.

Figure 1:
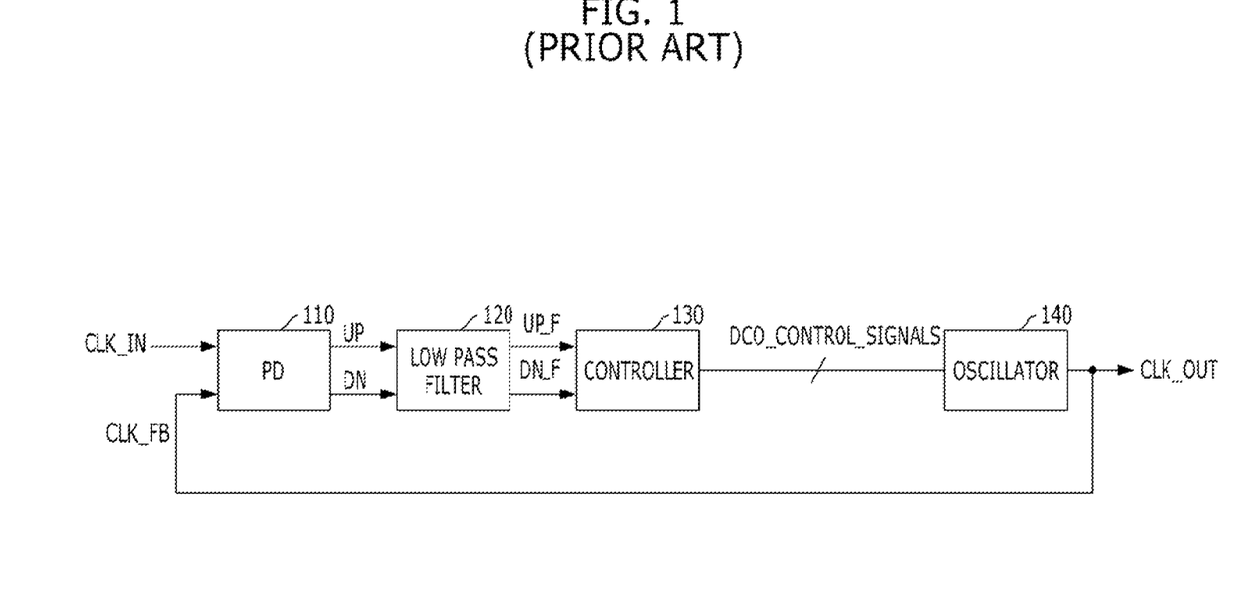
FIG. 1 is a block view illustrating a conventional phase locked loop.

FIG. 1 is a block view illustrating a conventional phase locked loop.

Referring to FIG. 1, the phase locked loop includes a phase detector (PD) 110, a low pass filter 120, a controller 130, and an oscillator 140.

The phase detector 110 compares the phase of an input clock CLK_IN with the phase of a feedback clock CLK_FB and outputs the comparison result as an up signal UP and a down signal DN.

The low pass filter 120 filters noise from the up signal UP and the down signal DN.

The controller 130 generates oscillator control signals DCO_CONTROL_SIGNALS in response to noise-free up and down signals UP_F and DN_F outputted from the low pass filter 120. Depending on whether the noise-free up signal UP_F is enabled or the noise-free down signal DN_F is enabled, the controller 130 generates the oscillator control signals DCO_CONTROL_SIGNALS to increase or decrease the frequency of an output clock CLK_OUT generated in the oscillator 140.

The oscillator 140 generates the output clock CLK_OUT in response to the oscillator control signals DCO_CONTROL_SIGNALS. The frequency of the output dock CLK_OUT is determined based on the oscillator control signals DCO_CONTROL_SIGNALS. The oscillator 140 of this type is generally called a digital-controlled oscillator (DCO).

FIG. 1 illustrates an example where no circuits exist on the feedback loop, which is the current path for feeding back the output clock CLK_OUT as a feedback clock CLK_FB. A divider may be added to the feedback loop for the input dock CLK_IN and the output clock CLK_OUT, so that they may have different frequencies from each other.

The phase locked loop starts operating from the initial frequency of the output clock CLK_OUT, e.g., 300 Mhz, and operates in such a manner that it increases or decreases the frequency based on the phase comparison result produced in the phase detector 110. When the phase locked loop reaches a target frequency for the output clock CLK_OUT, it does not change the frequency of the output clock CLK_OUT anymore. When the frequency is no longer changed, the phase locked loop is said to be locked.

Herein, when the feedback loop does not include a divider as illustrated in FIG. 1, the target frequency of the output clock CLK_OUT is the same as the frequency of the input clock CLK_IN. When the feedback loop includes a divider, the target frequency of the output clock CLK_OUT becomes N times the frequency of the input clock CLK_IN, where N is a frequency division ratio of the divider.

Figure 2A:
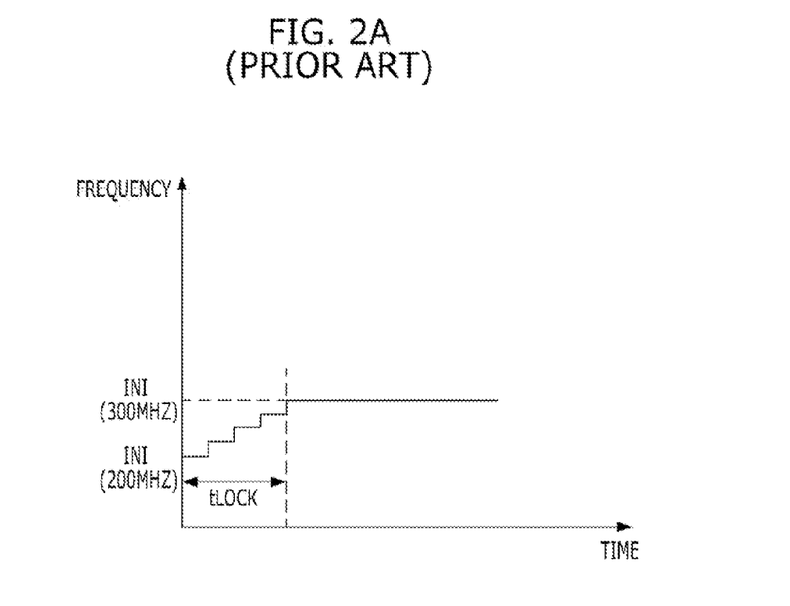
FIGS. 2A and 2B are graphs showing a process of changing the frequency of an output clock CLK_OUT toward the target frequency according to the operation of a phase locked loop.
Figure 2B:
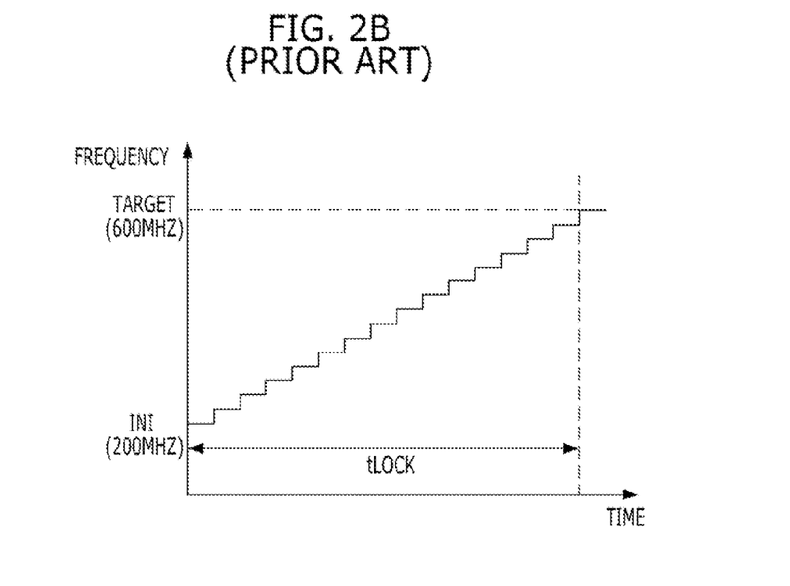

FIGS. 2A and 2B are graphs showing a process of changing the frequency of the output clock CLK_OUT toward the target frequency according to the operation of the phase locked loop.

FIG. 2A shows a case where the target frequency of the output clock CLK_OUT is 300 Mhz. The frequency of the output clock CLK_OUT begins from the initial frequency value INI, which is 200 Mhz, and gradually increases according to the operations of the phase detector 110 and the controller 130. When the frequency of the output clock CLK_OUT reaches 300 Mhz, the phase locked loop is locked. In the case shown in FIG. 2A, since the predetermined initial frequency value INI of the output clock CLK_OUT and the target frequency of the output clock CLK_OUT have a relatively small difference of 100 Mhz, the locking time tLOCK may be relatively short.

FIG. 2B shows a case where the target frequency of the output clock CLK_OUT is 600 Mhz. The frequency of the output clock CLK_OUT begins from the initial frequency value INT, which is 200 Mhz, and gradually increases according to the operations of the phase detector 110 and the controller 130. When the frequency of the output clock CLK_OUT reaches 600 Mhz, the phase locked loop is locked. In the case shown in FIG. 28 since the predetermined initial frequency value INT of the output clock CLK_OUT and the target frequency of the output clock CLK_OUT have a relatively great difference of 400 Mhz, the locking time tLOCK may be relatively long.

The locking time of the conventional phase locked loop is changed according to the target frequency of an output clock. To be specific, as the difference between the target frequency and the initial frequency value of the output clock increases, the locking time becomes longer.

Since systems have been designed not to have a fixed operation frequency but to have varying diverse operation frequencies, the locking time of the phase locked loop may be a serious concern.

SUMMARY OF THE INVENTION

Exemplary embodiments of the present invention are directed to reducing the locking time of a phase locked loop.

Exemplary embodiments of the present invention are directed to a phase locked loop having a short locking time although the target frequency value of an output clock is changed.

In accordance with an exemplary embodiment of the present invention, a phase locked loop includes a phase detector configured to compare a phase of an input clock with a phase of a feedback clock to produce a phase comparison result, an initial frequency value provider configured to detect a frequency of the input clock and provide a frequency detection result, a controller configured to generate a frequency control signal based on the phase comparison result and the frequency detection result, and an oscillator configured to generate an output clock in response to the frequency control signal.

In accordance with another exemplary embodiment of the present invention, a phase locked loop includes a phase detector configured to compare a phase of an input clock with a phase of a feedback dock to produce a phase comparison result, a charge pump configured to generate a charging current or a discharging current in response to the phase comparison result of the phase detector, a loop filter configured to generate a control voltage in response to the charging current or the discharging current, an oscillator configured to generate an output clock in response to the control voltage, and an initial frequency value provider configured to detect a frequency of the input clock to produce a frequency detection result and provide the loop filter with an initial value of the control voltage according to the frequency detection result.

In accordance with yet another exemplary embodiment of the present invention, a method for operating a phase locked loop includes detecting a frequency of an input clock to produce a frequency detection result, determining an initial frequency of an output clock based on the frequency detection result, comparing a phase of the input clock with a phase of a feedback clock to produce a phase comparison result, and increasing or decreasing the frequency of the output clock based on the phase comparison result.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
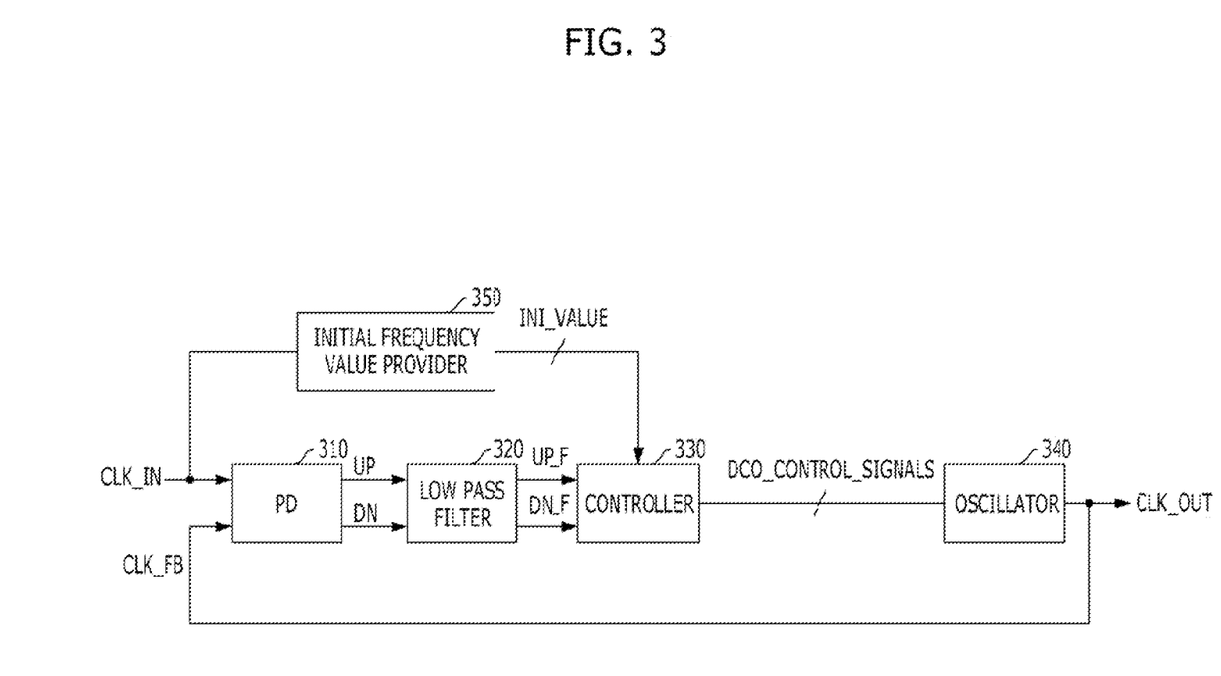
FIG. 3 is a block view illustrating a phase locked loop in accordance with an exemplary embodiment of the present invention.

FIG. 3 is a block view illustrating a phase locked loop in accordance with an exemplary embodiment of the present invention.

Referring to FIG. 3, the phase locked loop includes a phase detector 310, a controller 330, an oscillator 340, and an initial frequency value provider 350. The phase detector 310 compares the phase of an input clock CLK_IN with the phase of a feedback clock CLK_FB. The controller 330 generates oscillator control signals DCO_CONTROL_SIGNALS according to the phase comparison result, which is an up signal UP or a down signal DN produced in the phase detector 310. The oscillator 340 generates an output clock CLK_OUT in response to the oscillator control signals DCO_CONTROL_SIGNALS. The initial frequency value provider 350 detects the frequency of the input clock CLK_IN and provides the controller 330 with initial frequency value information INI_VALUE according to the frequency detection result. The phase locked loop may further include a low pass filter 320 for transferring the phase comparison result, which is the up signal UP or the down signal DN produced in the phase detector 310, to the controller 330.

To be specific, the phase detector 310 compares the phase of the input clock CLK_IN with the phase of the feedback dock CLK_FB and outputs the phase comparison result as the up signal UP or the down signal DN.

The low pass filter 320 filters noise out of the up signal UP or the down signal DN. Since the function of the low pass filter 320 is removing noise, the low pass filter 320 is not essential to the phase locked loop and the phase locked loop may not include the low pass filter 320. Of course, the phase locked loop can perform the operation more stably with the low pass filter 320.

The controller 330 generates the oscillator control signals DCO_CONTROL_SIGNALS in response to the noise-free up or down signal UP_F or DN_F, which is acquired by removing noise from the up or down signal UP or DN in the low pass filter 320. According to whether the noise-free up signal UP_F is enabled or the noise-free down signal DN_F is enabled, the controller 330 generates the oscillator control signals DCO_CONTROL_SIGNALS so as to increase or decrease the frequency of the output clock CLK_OUT generated in the oscillator 340.

Although the controller 130 of the conventional phase locked loop shown in FIG. 1 generates the oscillator control signals DCO_CONTROL_SIGNALS based on a certain initial frequency value, the controller 330 of the phase locked loop according to one exemplary embodiment of the present invention determines the initial frequency value of the output clock CLK_OUT based on the initial frequency value information INI_VALUE supplied by the initial frequency value provider 350.

For example, when the initial frequency value provider 350 provides information indicating that the initial frequency value of the output clock CLK_OUT is 400 Mhz, the controller 330 generates the oscillator control signals DCO_CONTROL_SIGNALS in such a manner that the output clock CLK_OUT has the initial frequency value of 400 Mhz. Likewise, when the initial frequency value provider 350 provides information indicating that the initial frequency value of the output clock CLK_OUT is 600 Mhz, the controller 330 generates the oscillator control signals DCO_CONTROL_SIGNALS in such a manner that the output clock CLK_OUT has the initial frequency value of 600 Mhz.

When the initial frequency value of the output clock CLK_OUT is determined based on the initial frequency value information INI_VALUE provided by the initial frequency value provider 350, the controller 330 performs a control to increase or decrease the frequency of the output clock CLK_OUT from the determined initial frequency value in response to the inputted noise-free up or down signal UP_F or DN_F.

The oscillator 340 generates the output clock CLK_OUT in response to the oscillator control signals DCO_CONTROL_SIGNALS This means that the frequency of the output clock CLK_OUT is determined based on the oscillator control signals DCO_CONTROL_SIGNALS. The oscillator 340 of this type is generally called a digital-controlled oscillator (DCO).

The initial frequency value provider 350 detects the frequency of the input clock CLK_IN and provides the controller 330 with the initial frequency value information INI_VALUE based on the frequency detection result. The target frequency of the output clock CLK_OUT is determined based on the input clock CLK_IN. When a feedback loop does not include a divider, that is, when the output clock CLK_OUT becomes the feedback clock. CLK_FB as it is, the target frequency of the output clock CLK_OUT is the same as the frequency of the input clock CLK_IN. When a feedback loop includes a divider having a frequency division ratio of 1/N, the target frequency of the output clock CLK_OUT is N times the frequency of the input clock CLK_IN. Therefore, when the initial frequency value provider 350 detects the frequency of the input clock CLK_IN, the controller 330 can be provided with information for generating the target frequency of the output clock CLK_OUT. Also, even if the initial frequency value provider 350 detects the frequency of the input clock CLK_IN roughly, the controller 330 can be provided with information that allows it to generate frequency that is very close to the target frequency of the output clock CLK_OUT.

The initial frequency value provider 350 may detect the frequency of the input clock CLK_IN based on an oversampling scheme, which is described below with reference to the accompanying drawings.

Figure 4:
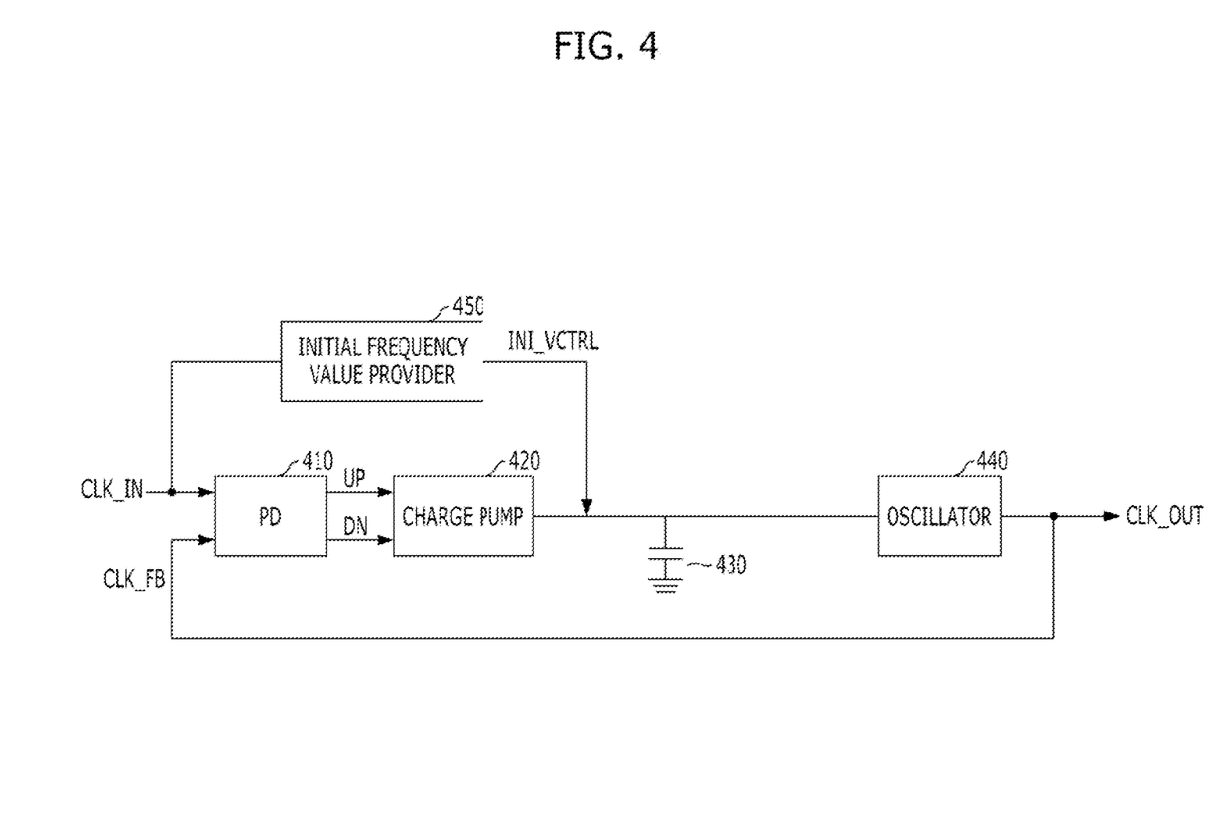
FIG. 4 is a block view illustrating a phase locked loop in accordance with another exemplary embodiment of the present invention.

FIG. 4 is a block view illustrating a phase locked loop in accordance with another exemplary embodiment of the present invention.

FIG. 4 illustrates an example where the technology of the present invention is applied to an analog phase locked loop, as opposed to the digital phase locked loop in FIG. 3. Referring to FIG. 4, the analog phase locked loop includes a phase detector 410, a charge pump 420, a loop filter 430, an oscillator 440, and an initial frequency value provider 450. The phase detector 410 compares the phase of an input clock CLK_IN with the phase of a feedback clock CLK_FB. The charge pump 420 generates a charging current or a discharging current in response to the comparison result, which is an up signal UP or a down signal DN, produced by the phase detector 410. The loop filter 430 generates a control voltage VCTRL in response to the charging current or the discharging current. The oscillator 440 generates an output clock CLK_OUT in response to the control voltage VCTRL. The initial frequency value provider 450 detects the frequency of the input clock CLK_IN and charges the loop filter 430 with an initial control voltage INI_VCTRL based on the frequency detection result.

To be specific, the phase detector 410 compares the phase of the input clock CLK_IN with the phase of the feedback clock CU_FB and outputs the phase comparison result as the up signal UP or the down signal DN.

The charge pump 420 generates the charging current and the discharging current in response to the up signal UP or the down signal DN. The charging current is a current for increasing the level of the control voltage VCTRL, while the discharging current is a current for decreasing the level of the control voltage VCTRL. Therefore, when the charge pump 420 generates the charging current, the level of the control voltage VCTRL charged in the loop filter 430 increases. When the charge pump 420 generates the discharging current, the level of the control voltage VCTRL charged in the loop filter 430 decreases.

The oscillator 440 generates the output clock CLK_OUT in response to the control voltage VCTRL charged in the loop filter 430. The higher the level of the control voltage VCTRL is, the higher the frequency of the output clock CLK_OUT becomes. The lower the level of the control voltage VCTRL is, the lower the frequency of the output clock CLK_OUT becomes. The oscillator 440 of this type is generally called a voltage-controlled oscillator (VCO).

The initial frequency value provider 450 detects the frequency of the input clock CLK_IN and charges the loop filter 430 with the initial control voltage INI_VCTRL which is generated based on the frequency detection result. The target frequency of the output clock. CLK_OUT is determined based on the input clock CLK_IN. When a feedback loop does not include a divider, the target frequency of the output clock CLK_OUT is the same as the frequency of the input clock CLK_IN. When the feedback loop includes a divider having a frequency division ratio of 1/N, the target frequency of the output clock CLK_OUT is N times the frequency of the input dock CLK_IN. Therefore, when the initial frequency value provider 450 detects the frequency of the input clock CLK_IN, the initial value of the control voltage VCTRL may be set in such a manner that a frequency value close to the target frequency of the output clock CLK_OUT becomes the initial frequency value of the output clock CLK_OUT. As a result of the initial frequency value provider 450 detecting the frequency of the input clock CLK_IN, when the detected frequency of the input clock CLK_IN is relatively high, the initial control voltage INI_VCTRL may be set to a high level. When the detected frequency of the input clock CLK_IN is relatively low, the initial control voltage INI_VCTRL may be set to a low level. Then, the loop filter 430 is charged accordingly. The initial frequency value provider 450 may measure the frequency of the input clock CLK_IN based on an oversampling scheme. The oversampling scheme is described below with reference to the accompanying drawings.

In a method of providing the initial frequency value of the output clock CLK_OUT, while the initial frequency value provider 350 shown FIG. 3 provides the controller 330 with the initial value information INI_VALUE in the form of digital information, the initial frequency value provider 450 shown FIG. 4 charges the loop filter 430 with the initial control voltage INI_VCTRL in the form of an analog voltage.

According to the technology of the present invention, the initial frequency value provider 450 measures the frequency of the input clock CLK_IN in the initial operation of the phase locked loop, and the loop filter 430 is charged with the initial control voltage INI_VCTRL generated as a result of the measurement of the frequency of the input clock CLK_IN. Subsequently, the control voltage VCTRL is increased or decreased based on the comparison result, which is the up signal UP or the down signal DN, produced in the phase detector 410, and the frequency of the output clock CLK_OUT is controlled according to the increased or decreased control voltage VCTRL. Therefore, the initial frequency of the output clock CLK_OUT may be set close to the target frequency, and thus, the phase locked loop of an exemplary embodiment of the present invention may quickly reach the target frequency. In other words, the phase locked loop of an exemplary embodiment of the present invention may have a fast locking time.

To sum up, the phase locked loop according to an exemplary embodiment of the present invention sets the frequency of the output clock CLK_OUT close to the target frequency within a short time by using an open loop method and then performs an operation of exactly matching the frequency of the output clock CLK_OUT to the target frequency by using a closed loop method.

Figure 5:
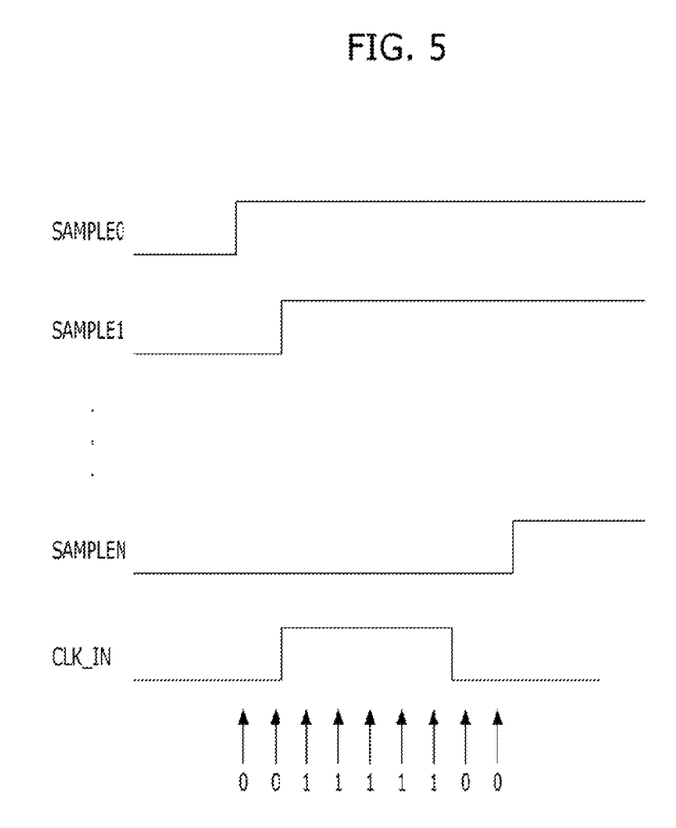
FIG. 5 shows an operation of detecting the frequency of an input clock CLK_IN based on an oversampling scheme in an initial frequency value provider 350 or 450.

FIG. 5 shows the operation of detecting the frequency of the input clock CLK_IN based on an oversampling scheme in the initial frequency value provider 350 or 450.

The initial frequency value provider 350 or 450 sequentially delays a sampling reference signal SAMPLE0 by a certain delay value and generates a plurality of sampling reference signals SAMPLE1 to SAMPLEN. For example, a sampling reference signal SAMPLE1 is a signal delayed by 0.2 ns from the sampling reference signal SAMPLE0, and a sampling reference signal SAMPLE2 is a signal delayed by 0.2 ns from the sampling reference signal SAMPLE1.

With the plurality of the sampling reference signals SAMPLE1 to SAMPLEN, the logic value of the input clock CLK_IN is sampled/detected at the rising edges of the respective sampling reference signals SAMPLE1 to SAMPLEN. Such process is shown at the bottom of FIG. 5. The first arrow mark from the left indicates '0' detected after sampling the logic value of the input clock CLK_IN at the rising edge of the sampling reference signal SAMPLE0, and the second arrow mark from the left indicates '0' detected after sampling the logic value of the input clock CLK_IN at the rising edge of the sampling reference signal SAMPLE1. Likewise, the third to ninth arrow marks from the left indicate '1,' '1,' '1,' '1,' '1,' '0,' and '0' detected after sampling the logic value of the input clock CLK_IN at the rising edges of sampling reference signals SAMPLE2 to SAMPLE8, respectively.

At the rising edges of the sampling reference signals SAMPLE0 and SAMPLE1, '0' is sampled, and '1' is sampled at the rising edges of the sampling reference signals SAMPLE2 to SAMPLE6, and then '0' is sampled again at the rising edges of the sampling reference signals SAMPLE7 and SAMPLE8. As described, when sampling is performed in the sequence of '0'→'1'→'0,' the length of a duration where '1' is sampled becomes the length of the duration where the input clock CLK_IN is enabled, that is a pulse width of the input clock CLK_IN. Referring to FIG. 5, '1' is detected five times, and since the difference in delay values between the sampling reference signals SAMPLE0 to SAMPLEN is 0.2 ns, it may be concluded that the pulse width (which is the length of a half-period) of the input clock CLK_IN is 1 ns (=0.2 ns×5).

If the sampling is performed in the sequence of '1'→'0'→'1,' it is understood that the frequency of the input clock CLK_IN may be detected by measuring the length of the duration where '0' is sampled. Also, the number of the sampling reference signals SAMPLE0 to SAMPLEN and the delay value between the sampling reference signals SAMPLE0 to SAMPLEN may be changed as needed.

This method is called an oversampling scheme. The initial frequency value provider 350 or 450 according to an exemplary embodiment of the present invention detects the frequency of the input clock CLK_IN through the oversampling scheme and the initial frequency value is determined based on the detected frequency of the input clock CLK_IN.

As for the sampling reference signal SAMPLE0, any signal having a rising edge may be used. One among the signals used in a system employing the phase locked loop may be used as the sampling reference signal SAMPLE0. Also, since the input clock CLK_IN and the output clock CLK_OUT also have rising edges, they may be used as the sampling reference signal as well.

Figure 6:
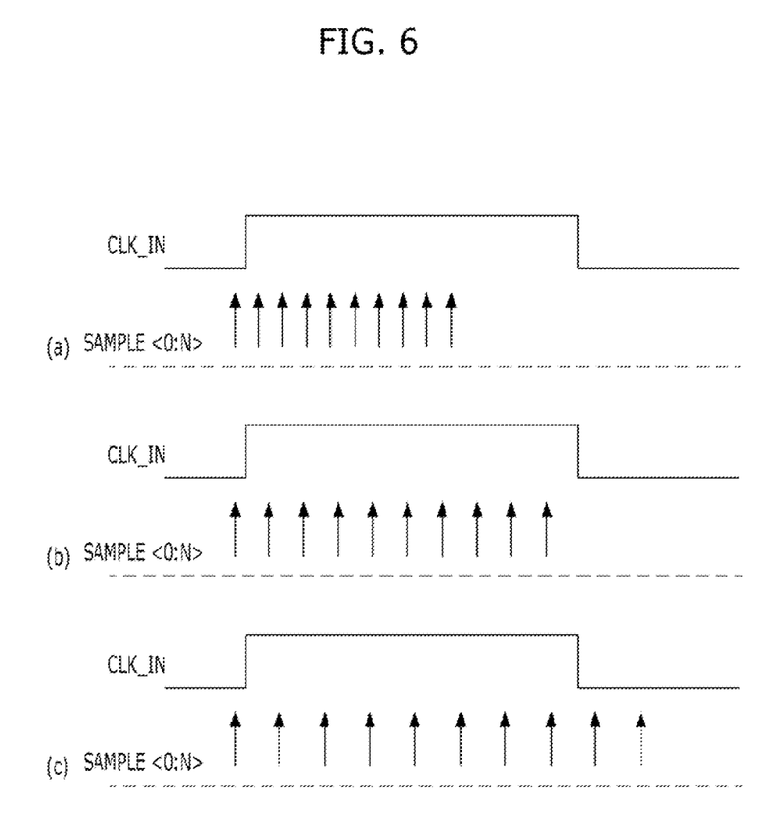
FIG. 6 shows an operation of detecting the frequency of an input clock CLK_IN based on another oversampling scheme, which is different from the oversampling scheme shown in FIG. 5, in the initial frequency value providers 350 and 450.

FIG. 6 shows an operation of detecting the frequency of the input clock CLK_IN based on another oversampling scheme, which is different from the oversampling scheme shown in FIG. 5, in the initial frequency value provider 350 or 450.

The following processes of (a), (b) and (c) are performed to detect the frequency of the input clock CLK_IN.

In process (a), the initial frequency value provider 350 generates a plurality of sampling reference signals SAMPLE<0:N> by sequentially delaying a sampling reference signal SAMPLE0 (not shown in FIG. 6, refer to FIG. 5) by a first delay value. At the rising edges (arrow marks in FIG. 6) of the plurality of the sampling reference signals SAMPLE<0:N>, the logic value of the input clock CLK_IN is sampled. The logic value of the input clock CLK_IN is to be sampled in the sequence of '0'→'1'→'0,' or in the sequence of '1'→'0'→'1' to detect the frequency of the input clock. CLK_IN. However, in the process (a) of FIG. 6, since the input clock CLK_IN is sampled in the sequence of '0'→'1,' the frequency of the input clock CLK_IN is not detected.

In process (b), since the detection of the frequency of the input clock CLK_IN failed in process (a), the initial frequency value provider 350 generates a plurality of sampling reference signals SAMPLE<0:N> again by sequentially delaying the sampling reference signal SAMPLE0 by a second delay value, which is greater than the first delay value. Subsequently, the logic value of the input clock CLK_IN is sampled at the rising edges of the re-generated sampling reference signals SAMPLE<0:N>. Referring to the process (b) of FIG. 6, since the input clock CLK_IN is sampled in the sequence of '0'→'1', just as in process (a), the detection of the frequency of the input clock CLK_IN fails again.

In process (c), since the detection of the frequency of the input clock CLK_IN failed in process (b), the initial frequency value provider 350 generates a plurality of sampling reference signals SAMPLE<0:N> again by sequentially delaying the sampling reference signal SAMPLE0 by a third delay value, which is greater than the second delay value. Subsequently, the logic value of the input clock CLK_IN is sampled at the rising edges of the re-generated sampling reference signals SAMPLE<0:N>. Since the logic value of the input clock CLK_IN is sampled in the sequence of '0'→'1'→'0' in process (c), the frequency of the input clock CLK_IN is detected successfully.

The delay value between the sampling reference signals SAMPLE<0:N> is increased through the processes (a), (b), and (c). When the delay value between the sampling reference signals SAMPLE<0:N> is small, the frequency of the input clock CLK_IN may be detected based on a higher level of resolution. However, when the delay value between the sampling reference signals SAMPLE<0:N> is small, the frequency of the input clock CLK_IN may not be detected. Therefore, the delay value between the sampling reference signals SAMPLE<0:N> is set to be small in the initial duration, and when the detection of the frequency of the input clock CLK_IN fails, the delay value between the sampling reference signals SAMPLE<0:N> may be gradually increased to detect the frequency of the input clock CLK_IN.

In other words, after the frequency of the input clock CLK_IN is detected in process (a), if the frequency of the input clock CLK_IN is detected successfully, the operation stops. When the frequency of the input clock CLK_IN fails to be detected, the frequency of the input clock CLK_IN may be detected in process (b). Of course, if the detection of the frequency of the input clock CLK_IN fails again in process (b), the operation for detecting the frequency of the input clock CLK_IN is performed again in the process (c).

Figure 7A:
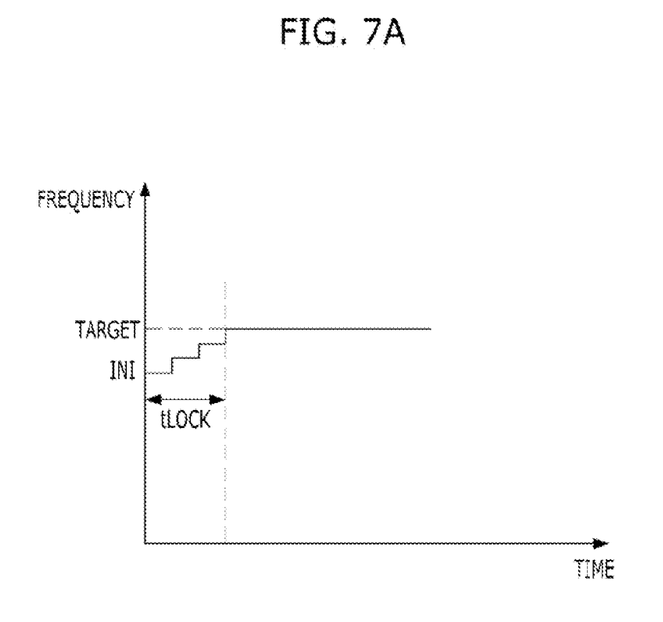
FIGS. 7A and 7B are graphs showing a process of changing the frequency of an output clock CLK_OUT toward the target frequency according to the operation of a phase locked loop.
Figure 7B:
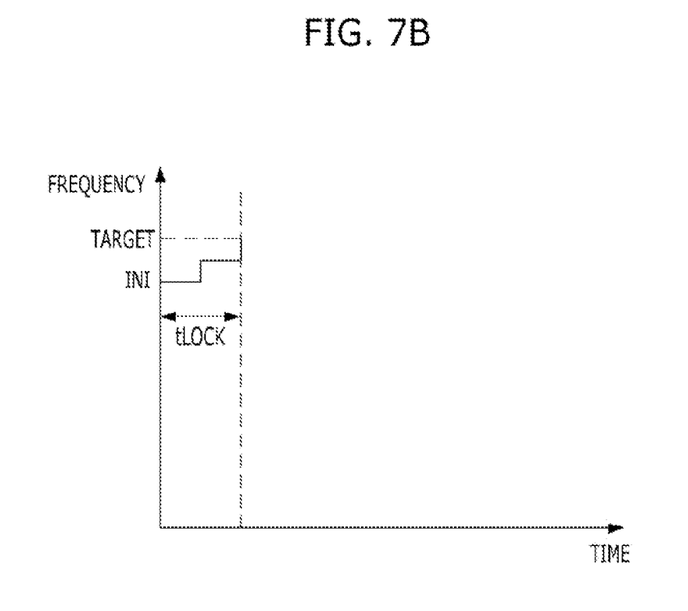

FIGS. 7A and 7B are graphs showing a process of changing the frequency of the output clock CLK_OUT toward the target frequency according to the operation of a phase locked loop.

FIG. 7A illustrates an operation of the initial frequency value provider 350 or 450 when the target frequency TARGET of the output clock CLK_OUT is 300 Mhz. The initial frequency value INT of the output clock CLK_OUT is set to around 300 Mhz by the operation of the initial frequency value provider 350 or 450, and the frequency of the output clock CLK_OUT is increased from the initial frequency value INI to the target frequency TARGET. It may be seen that the locking time tLOCK becomes very short.

FIG. 7B illustrates an operation of the initial frequency value provider 350 or 450 when the target frequency TARGET of the output clock CLK_OUT is 600 Mhz. The initial frequency value INI of the output clock CLK_OUT is set to around 600 Mhz by the operation of the initial frequency value provider 350 or 450, and the frequency of the output clock CLK_OUT is increased from the initial frequency value INI to the target frequency TARGET. Therefore, the phase locked loop can also have a very short locking time tLOCK.

As described above, whatever frequency the input clock CLK_IN has (that is, whatever target frequency TARGET the output clock CLK_OUT has), a frequency value around the target frequency TARGET of the output clock CLK_OUT can be set as the initial frequency value INI of the output clock CLK_OUT. Therefore, the phase locked up may have a short locking time in any case.

Referring to FIGS. 3 to 7B, an operation process of the phase locked loop according to an exemplary embodiment of the present invention is described hereafter.

(1) When the phase locked loop begins to operate, first, the initial frequency value provider 350 or 450 detects the frequency of the input clock CLK_IN, and then the initial frequency value of the output clock CLKOUT is determined based on the detected frequency of the input clock CLK_IN. The digital phase locked loop shown in FIG. 3 provides the controller 330 with the initial frequency value information INI_VALUE so as to set the initial frequency value of the output clock CLK_OUT. The analog phase locked loop shown in FIG. 4 charges the loop filter 40 with the initial control voltage INI_VCTRL so as to set the initial frequency value of the output clock CLK_OUT.

(2) After the initial frequency value of the output clock CLK_OUT is determined, the phase detector 310 or 410 compares the phase of the input clock CLK_IN with the phase of the feedback clock CLK_FB. According to the phase comparison result, which is the up signal UP or the down signal DN, the frequency of the output clock CLK_OUT is increased or decreased. In case of the digital phase locked loop shown in FIG. 3, the frequency of the output clock CLK_OUT is increased or decreased based on the operations of the oscillator 340 and the controller 330. In case of the analog phase locked loop shown in FIG. 4, the frequency of the output clock CLK_OUT is increased or decreased based on the operations of the charge pump 420, the loop filter 430, and the oscillator 340. Herein, the process of comparing the phase of the input clock CLK_IN with the phase of the feedback clock CLK_FB and controlling the frequency of the output clock CLK_OUT based on the phase comparison result may be performed repeatedly.

As described above, the phase locked loop according to an exemplary embodiment of the present invention sets the initial frequency of the output clock CLK_OUT close to the target frequency through the open loop operation described in the process (1), and accurately matches the frequency of the output clock CLK_OUT to the target frequency through the closed loop operation described in the process (2).

According to the technology of the present invention, the frequency of an input clock inputted into a phase locked loop is detected, and the initial frequency of an output clock outputted from the phase locked loop is determined based on the detected frequency of the input clock. Therefore, the phase locked loop begins to operate from the initial frequency which is close to a target frequency of the output clock, and thus, the locking time of the phase locked loop may be shortened.

While the present invention has been described with respect to the specific embodiments, it will be apparent to those skilled in the art that various changes and modifications may be made without departing from the spirit and scope of the invention as defined in the following claims.

What is claimed is:

1. A phase locked loop, comprising:

a phase detector configured to compare a phase of an input clock with a phase of a feedback clock to produce a phase comparison result;

a charge pump configured to generate a charging current or a discharging current in response to the phase comparison result of the phase detector;

a loop filter configured to generate a control voltage in response to the charging current or the discharging current;

an oscillator configured to generate an output clock in response to the control voltage; and an initial frequency value provider configured to detect a frequency of the input clock to produce a frequency detection result and provide the loop filter with an initial value of the control voltage according to the frequency detection result wherein, the initial frequency value provider detects the frequency of the input clock by detecting a logic value of the input clock at rising edges of first to $N^{th}$ delay signals, where N is any positive integer, and the first to $N^{th}$ delay signals are obtained by sequentially delaying a sampling reference signal by a first delay value.

2. The phase locked loop of claim 1, wherein the initial frequency value provider measures a pulse width of the input clock through an oversampling scheme and detects the frequency of the input clock based on the measured pulse width.

3. The phase locked loop of claim 1, wherein the initial frequency value provider increases the initial values of the control voltage, as the detected frequency of the input clock increases.

4. The phase locked loop of claim 1, wherein, when the initial frequency value provider fails to detect the frequency of the input clock, the initial frequency value provider re-generates the first to $N^{th}$ delay signals by sequentially delaying the sampling reference signal by a second delay value, which is greater than the first delay value, and detects the frequency of the input clock by detecting a logic value of the input clock at rising edges of the re-generated first to $N^{th}$ delay signals.

5. The phase locked loop of claim 1, wherein, when the frequency of the input clock is detected in the detecting of the logic value of the input clock at the rising edges of the first to $N^{th}$ delay signals, the initial frequency value provider ends the operation of detecting the frequency of the input clock.

* * * * *